US012656404B2

(12) United States Patent
Yamagami et al.

(10) Patent No.: US 12,656,404 B2
(45) Date of Patent: Jun. 16, 2026

---

(54) SECONDARY BATTERY SYSTEM

(71) Applicant: DENSO CORPORATION, Kariya-city (JP)

(72) Inventors: Yuji Yamagami, Kariya-city (JP); Masaaki Kitagawa, Kariya-city (JP); Hisashi Umemoto, Kariya-city (JP); Shuhei Yoshida, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 762 days.

(21) Appl. No.: 18/074,566

(22) Filed: Dec. 5, 2022

(65) Prior Publication Data

US 2023/0231209 A1      Jul. 20, 2023

(30) Foreign Application Priority Data

Jan. 20, 2022      (JP) ................................. 2022-006979

(51) Int. Cl.
| | |
|---|---|
| *G01R 31/389* | (2019.01) |
| *G01R 31/374* | (2019.01) |
| *G01R 31/392* | (2019.01) |
| *H01M 10/42* | (2006.01) |
| *H02J 7/84* | (2026.01) |
| *G01R 31/36* | (2020.01) |
| *G01R 31/3842* | (2019.01) |
| *H01M 10/46* | (2006.01) |

(Continued)

(52) U.S. Cl.
CPC ......... *G01R 31/389* (2019.01); *G01R 31/392* (2019.01); *H02J 7/84* (2026.01); *G01R 31/3648* (2013.01); *G01R 31/374* (2019.01);

*G01R 31/3842* (2019.01); *H01M 10/42* (2013.01); *H01M 10/425* (2013.01); *H01M 2010/4271* (2013.01); *H01M 10/4285* (2013.01); *H01M 2010/4292* (2013.01); *H01M 10/46* (2013.01); *H01M 10/48* (2013.01); *H01M 10/484* (2013.01); *H01M 2220/20* (2013.01); *H02J 7/94* (2026.01)

(58) Field of Classification Search
CPC ...... G01R 31/389; G01R 31/392; H02J 7/005
USPC .......................................... 320/134; 324/430
See application file for complete search history.

(56) References Cited

U.S. PATENT DOCUMENTS

| | | | | |
|---|---|---|---|---|
| 5,677,081 | A | * 10/1997 | Iwamoto | ........... H01M 10/0562 |
| | | | | 429/225 |
| 5,680,031 | A | * 10/1997 | Pavlovic | .............. H02J 7/00711 |
| | | | | 320/152 |

(Continued)

FOREIGN PATENT DOCUMENTS

| | | |
|---|---|---|
| JP | 2018-190502 A | 11/2018 |
| JP | 2020034426 A | 3/2020 |

(Continued)

*Primary Examiner* — John T Trischler
(74) *Attorney, Agent, or Firm* — Harness, Dickey & Pierce, P.L.C.

(57) ABSTRACT

A secondary battery system includes a secondary battery having an electrode body impregnated with an electrolytic solution containing metal ions. The secondary battery system measures an impedance of the secondary battery. The secondary battery system detects high-rate deterioration caused by uneven concentration of the metal ions in the electrolytic solution impregnated into the electrode body.

7 Claims, 11 Drawing Sheets

(51) Int. Cl.
 *H01M 10/48*   (2006.01)
 *H02J 7/94*   (2026.01)

(56)   References Cited

U.S. PATENT DOCUMENTS

| | | | | |
|---|---|---|---|---|
| 6,037,778 | A * | 3/2000 | Makhija | G01R 31/389 |
| | | | | 324/427 |
| 6,167,349 | A * | 12/2000 | Alvarez | G01R 31/3835 |
| | | | | 702/63 |
| 6,369,577 | B1 * | 4/2002 | Cho | G01R 31/389 |
| | | | | 324/426 |
| 6,611,128 | B2 * | 8/2003 | Minamiura | B60L 3/0023 |
| | | | | 320/134 |
| 6,759,832 | B2 * | 7/2004 | Minamiura | H01M 10/482 |
| | | | | 320/150 |
| 7,626,394 | B2 * | 12/2009 | Kimura | G01R 31/3842 |
| | | | | 320/132 |
| 7,633,297 | B2 * | 12/2009 | Ishii | G01R 31/389 |
| | | | | 324/430 |
| 7,675,293 | B2 * | 3/2010 | Christophersen | G01R 31/367 |
| | | | | 324/613 |
| 7,956,615 | B1 * | 6/2011 | Jaoude | G01R 31/389 |
| | | | | 324/430 |
| 7,977,919 | B1 * | 7/2011 | Jaoude | H04B 1/06 |
| | | | | 320/136 |
| 8,035,397 | B1 * | 10/2011 | Jaoude | G01R 31/389 |
| | | | | 455/127.2 |
| 8,129,996 | B2 * | 3/2012 | Iwane | G01R 31/392 |
| | | | | 324/427 |
| 8,332,342 | B1 * | 12/2012 | Saha | G01R 31/392 |
| | | | | 706/45 |
| 8,536,837 | B1 * | 9/2013 | Jaoude | H04B 1/06 |
| | | | | 320/136 |
| 8,552,693 | B2 * | 10/2013 | Paryani | H02J 7/977 |
| | | | | 320/152 |
| 8,704,489 | B2 * | 4/2014 | Hamaguchi | H01M 10/44 |
| | | | | 320/136 |
| 8,754,613 | B2 * | 6/2014 | Takahashi | H02J 7/00 |
| | | | | 320/141 |
| 8,843,333 | B2 * | 9/2014 | Tezuka | G01R 31/392 |
| | | | | 702/63 |
| 9,069,046 | B2 * | 6/2015 | Morimoto | G01R 31/385 |
| 9,091,739 | B2 * | 7/2015 | Iwane | G01R 31/3842 |
| 9,325,193 | B2 * | 4/2016 | Kelly | H02J 7/0048 |
| 9,453,884 | B2 * | 9/2016 | Patin | G01R 31/001 |
| 9,465,077 | B2 * | 10/2016 | Love | G01R 31/389 |
| 9,618,584 | B2 * | 4/2017 | Kusano | G01R 31/3842 |
| 9,791,519 | B2 * | 10/2017 | Kelly | G01R 31/392 |
| 9,793,722 | B2 * | 10/2017 | Tamura | B60L 58/15 |
| 10,046,664 | B2 * | 8/2018 | Komiyama | G01R 31/389 |
| 10,493,849 | B2 * | 12/2019 | Kanada | B60L 58/10 |
| 10,516,188 | B2 * | 12/2019 | Onoda | H01M 4/1391 |
| 10,534,038 | B2 * | 1/2020 | Tanaka | H01M 10/48 |
| 10,594,145 | B1 * | 3/2020 | Wang | G01R 31/392 |
| 10,775,444 | B2 * | 9/2020 | Tashiro | G01R 31/3842 |
| 10,807,494 | B2 * | 10/2020 | Yonemoto | B60L 50/16 |
| 10,976,373 | B2 * | 4/2021 | Ohkanda | G01R 31/389 |
| 11,002,795 | B2 * | 5/2021 | Choi | G01R 31/389 |
| 11,009,556 | B2 * | 5/2021 | Soejima | G01R 31/389 |
| 11,054,481 | B2 * | 7/2021 | Christophersen | G01R 31/392 |
| 11,193,983 | B2 * | 12/2021 | Soejima | G01R 31/392 |
| 11,340,277 | B2 * | 5/2022 | Yamamoto | H02J 7/00 |
| 11,397,215 | B2 * | 7/2022 | Ghantous | H02J 7/0047 |
| 11,397,216 | B2 * | 7/2022 | Ghantous | G01R 31/392 |
| 11,422,198 | B2 * | 8/2022 | Shimonishi | H01M 10/425 |
| 11,428,745 | B2 * | 8/2022 | Haga | H02J 7/0013 |
| 11,437,654 | B2 * | 9/2022 | Yamashima | H01M 10/44 |
| 11,467,218 | B2 * | 10/2022 | Ogasawara | G01R 31/392 |
| 11,585,862 | B2 * | 2/2023 | Shimonishi | H01M 10/48 |
| 11,614,493 | B2 * | 3/2023 | Mizuno | G01R 31/389 |
| | | | | 429/62 |
| 11,728,525 | B2 * | 8/2023 | Ghantous | H02J 7/0047 |
| | | | | 702/63 |
| 11,835,588 | B2 * | 12/2023 | Kitagawa | G01R 31/389 |

| | | | | |
|---|---|---|---|---|
| 11,846,681 | B2 * | 12/2023 | Fukushima | H01M 10/425 |
| 11,860,235 | B2 * | 1/2024 | Sano | G01R 31/3648 |
| 11,971,456 | B2 * | 4/2024 | Christophersen | G01R 31/3648 |
| 12,025,674 | B2 * | 7/2024 | Nagano | G01R 31/392 |
| 12,132,339 | B2 * | 10/2024 | Ghantous | H02J 7/0048 |
| 12,136,708 | B2 * | 11/2024 | Ghantous | G01R 31/392 |
| 12,146,920 | B2 * | 11/2024 | Kim | G07C 5/0825 |
| 12,176,497 | B2 * | 12/2024 | Ghantous | H02J 7/0047 |
| 12,249,694 | B2 * | 3/2025 | Ghantous | H02J 7/0047 |
| 12,265,134 | B2 * | 4/2025 | Nagano | G01R 31/392 |
| 12,385,981 | B2 * | 8/2025 | Kitagawa | H01M 10/48 |
| 12,392,842 | B2 * | 8/2025 | Lee | H02L 7/005 |
| 2003/0052646 | A1 * | 3/2003 | Minamiura | B60L 58/13 |
| | | | | 320/122 |
| 2003/0178970 | A1 * | 9/2003 | Minamiura | B60L 3/12 |
| | | | | 320/116 |
| 2007/0257681 | A1 * | 11/2007 | Christophersen | G01R 31/367 |
| | | | | 324/426 |
| 2008/0169819 | A1 | 7/2008 | Ishii | |
| 2008/0204031 | A1 * | 8/2008 | Iwane | G01R 31/389 |
| | | | | 324/430 |
| 2010/0045298 | A1 * | 2/2010 | Iwane | G01R 31/3842 |
| | | | | 320/132 |
| 2010/0085015 | A1 * | 4/2010 | Hamaguchi | H01M 10/0525 |
| | | | | 320/134 |
| 2011/0001352 | A1 * | 1/2011 | Tamura | B60L 58/21 |
| | | | | 307/9.1 |
| 2011/0012562 | A1 * | 1/2011 | Paryani | H02J 7/977 |
| | | | | 320/152 |
| 2011/0018500 | A1 * | 1/2011 | Takahashi | H02J 7/00711 |
| | | | | 320/148 |
| 2012/0215472 | A1 * | 8/2012 | Tezuka | G01R 31/387 |
| | | | | 702/63 |
| 2012/0265462 | A1 * | 10/2012 | Iwane | G01R 31/392 |
| | | | | 702/63 |
| 2013/0141109 | A1 * | 6/2013 | Love | G01R 31/389 |
| | | | | 324/430 |
| 2013/0162258 | A1 * | 6/2013 | Patin | G01R 27/02 |
| | | | | 324/426 |
| 2013/0229156 | A1 * | 9/2013 | Brandon | B60L 3/0046 |
| | | | | 320/136 |
| 2014/0091767 | A1 * | 4/2014 | Tamura | B60L 58/24 |
| | | | | 320/126 |
| 2014/0159736 | A1 * | 6/2014 | Morimoto | H01M 10/48 |
| | | | | 324/426 |
| 2015/0002101 | A1 * | 1/2015 | Hasegawa | H01M 10/0525 |
| | | | | 320/136 |
| 2015/0002105 | A1 * | 1/2015 | Kelly | H02J 7/0048 |
| | | | | 702/63 |
| 2015/0160301 | A1 * | 6/2015 | Kusano | G01R 31/3842 |
| | | | | 320/134 |
| 2015/0276889 | A1 * | 10/2015 | Osaka | G01R 31/389 |
| | | | | 324/430 |
| 2016/0238666 | A1 * | 8/2016 | Kelly | G01R 31/392 |
| 2016/0375790 | A1 * | 12/2016 | Komiyama | B60L 58/12 |
| | | | | 320/136 |
| 2017/0256822 | A1 * | 9/2017 | Onoda | H01M 4/0404 |
| 2018/0128881 | A1 * | 5/2018 | Kelly | H02J 7/0048 |
| 2018/0208062 | A1 * | 7/2018 | Kanada | B60L 58/25 |
| 2018/0321326 | A1 * | 11/2018 | Tanaka | G01R 31/3842 |
| 2019/0023132 | A1 * | 1/2019 | Yonemoto | H01M 10/42 |
| 2019/0064282 | A1 * | 2/2019 | Haga | H01M 10/42 |
| 2019/0072618 | A1 * | 3/2019 | Ghantous | G01R 31/392 |
| 2019/0120910 | A1 * | 4/2019 | Ghantous | H01M 10/44 |
| 2019/0162796 | A1 * | 5/2019 | Soejima | G01R 31/3842 |
| 2019/0170830 | A1 * | 6/2019 | Ohkanda | G01R 19/16542 |
| 2019/0285702 | A1 * | 9/2019 | Tashiro | G01R 31/3648 |
| 2019/0293722 | A1 * | 9/2019 | Choi | G01R 31/36 |
| 2019/0361077 | A1 * | 11/2019 | Shimonishi | H01M 10/425 |
| 2020/0067145 | A1 * | 2/2020 | Yamashima | G01M 3/186 |
| 2020/0072909 | A1 | 3/2020 | Soejima et al. | |
| 2020/0300920 | A1 * | 9/2020 | Christophersen | H01M 10/48 |
| 2020/0371145 | A1 * | 11/2020 | Yamamoto | G01R 31/388 |
| 2020/0408844 | A1 * | 12/2020 | Ogasawara | G01K 13/00 |
| 2021/0018570 | A1 * | 1/2021 | Kitagawa | G01R 31/389 |
| 2021/0148987 | A1 * | 5/2021 | Ghantous | H02J 7/0047 |
| 2021/0255248 | A1 * | 8/2021 | Christophersen | H01M 10/48 |

(56)                References Cited

U.S. PATENT DOCUMENTS

| | | | | |
|---|---|---|---|---|
| 2021/0270907 A1* | 9/2021 | Shimonishi | ....... | H01M 10/4285 |
| 2022/0029443 A1* | 1/2022 | Konopka | .............. | H02J 7/0068 |
| 2022/0045544 A1* | 2/2022 | Kitagawa | ............. | H01M 10/48 |
| 2022/0065937 A1* | 3/2022 | Nagano | ................ | G01R 31/388 |
| 2022/0146583 A1* | 5/2022 | Kim | ...................... | G07C 5/008 |
| 2022/0179010 A1* | 6/2022 | Fukushima | .......... | G01R 31/367 |
| 2022/0196750 A1* | 6/2022 | Sano | ................. | G01R 31/3648 |
| 2022/0317198 A1* | 10/2022 | Ghantous | ............. | H01M 10/44 |
| 2022/0317199 A1* | 10/2022 | Ghantous | ............ | G01R 31/392 |
| 2022/0320611 A1* | 10/2022 | Mizuno | .............. | H01M 10/052 |
| 2022/0373602 A1* | 11/2022 | Kitagawa | ............. | H01M 10/48 |
| 2023/0006271 A1* | 1/2023 | Ghantous | ............ | G01R 31/392 |
| 2023/0039183 A1* | 2/2023 | Ohkawa | ............... | G01R 31/392 |
| 2023/0090001 A1* | 3/2023 | Yamagami | ......... | G01R 31/3842 |
| | | | | 702/63 |
| 2023/0324471 A1* | 10/2023 | Umemoto | ........... | G01R 31/396 |
| | | | | 702/63 |
| 2023/0335810 A1* | 10/2023 | Ghantous | ............. | G01R 31/392 |
| 2023/0393214 A1* | 12/2023 | Cha | ...................... | G01R 31/378 |
| 2023/0417837 A1* | 12/2023 | Lee | ........................ | B60L 58/16 |
| 2024/0027534 A1* | 1/2024 | Hori | ...................... | H01M 10/48 |
| 2024/0044827 A1* | 2/2024 | Ishigaki | .............. | G01R 31/389 |
| 2024/0094308 A1* | 3/2024 | Yoshida | .............. | G01R 31/388 |
| 2024/0125863 A1* | 4/2024 | Kitagawa | ............... | G01R 35/00 |
| 2024/0133960 A1* | 4/2024 | Kitagawa | ............... | G01R 27/02 |
| 2024/0133966 A1* | 4/2024 | Kitagawa | ............... | G01R 31/382 |
| 2024/0133967 A1* | 4/2024 | Kitagawa | ........... | G01R 31/3828 |
| 2024/0168100 A1* | 5/2024 | Kitagawa | ............. | G01R 31/389 |
| 2024/0201272 A1* | 6/2024 | Nagano | ................ | G01R 31/388 |
| 2024/0230770 A9* | 7/2024 | Kitagawa | ................. | H02J 7/00 |
| 2024/0230776 A9* | 7/2024 | Kitagawa | ......... | H01M 10/0587 |
| 2024/0230777 A9* | 7/2024 | Kitagawa | ................. | H02J 7/00 |
| 2024/0248146 A1* | 7/2024 | Christophersen | .... | G01R 31/389 |
| 2024/0272235 A1* | 8/2024 | Shimonishi | ............... | H02J 7/00 |
| 2024/0283040 A1* | 8/2024 | Ghantous | ............ | G01R 31/392 |
| 2024/0304878 A1* | 9/2024 | Wampler | ........... | H01M 10/488 |
| 2024/0313274 A1* | 9/2024 | Ghantous | ............. | H02J 7/0047 |
| 2024/0377458 A1* | 11/2024 | Munakata | ............ | G01R 31/367 |
| 2024/0385250 A1* | 11/2024 | Yoshida | ................ | H01M 10/48 |
| 2025/0020728 A1* | 1/2025 | Kitagawa | ............ | G01R 31/382 |
| 2025/0130285 A1* | 4/2025 | Yoshida | .............. | G01R 31/374 |
| 2025/0252175 A1* | 8/2025 | Takizawa | ............... | G06F 21/44 |

FOREIGN PATENT DOCUMENTS

| | | |
|---|---|---|
| JP | 2022003633 A | 1/2022 |
| WO | 2006022073 A1 | 3/2006 |

* cited by examiner $$\left\{ -j\sum_i \frac{|I_{ex_i}(P)|}{|I_m(\omega_I)|} e^{j(-\theta_{Pex_i})} \Sigma_{ex_i} \right\}$$

Harmonic Component Expression

HIGH-RATE DETERIORATION SIMULATION CYCLE CONDITION

IMPEDANCE ACQUISITION SECTION
+SOC20 DCIR

25 A_CC CHARGE
4V

10 A_CC CHARGE
4V

100 A_CC CHARGE
3V

SOC 50_SOC ADJUSTMENT
CCCV

DCIR
MEASUREMENT

DCIR IS
0.5C, 1C, 2C

100cyc

REPEAT UNTIL 500 cyc

USE AS DETERMINATION OF HIGH-RATE DETERIORATION

Re@1116Hz

USE AS DETERMINATION OF HIGH-RATE DETERIORATION

|  | CONVENTIONAL METHOD | PRESENT DISCLOSURE |
|---|---|---|
| CELL AFTER STORAGE DETERIORATION TEST | OUTPUT: 0.1 mΩ | OUTPUT: 0 mΩ |
|  | DETERMINATION: HIGH-RATE DETERIORATION | DETERMINATION: HIGH-RATE DETERIORATION |
| CELL AFTER HIGH-RATE DETERIORATION CYCLE | OUTPUT: 0.1 mΩ | OUTPUT: 0.05 mΩ |
|  | DETERMINATION: HIGH-RATE DETERIORATION | DETERMINATION: HIGH-RATE DETERIORATION |

SECONDARY BATTERY SYSTEM

CROSS REFERENCE TO RELATED APPLICATION

This application is based on Japanese Patent Application No. 2022-006979 filed on Jan. 20, 2022, the disclosure of which is incorporated herein by reference.

TECHNICAL FIELD

The present disclosure relates to a secondary battery system.

BACKGROUND

As a deterioration mode of a secondary battery, specific deterioration different from normal deterioration due to aging is known. The specific deterioration is called, for example, high-rate deterioration. In order to improve safety of the secondary battery, it is desired to quickly detect occurrence of the high-rate deterioration and to suppress progress of the high-rate deterioration.

The high-rate deterioration is a temporary increase in internal resistance observed when the secondary battery is charged or discharged at a high input or output value. It is considered that the high-rate deterioration is caused by occurrence of deviation of electrolytic solution inside the secondary battery.

SUMMARY

The present disclosure provides a secondary battery system that includes a secondary battery having an electrode body impregnated with an electrolytic solution containing metal ions. The secondary battery system measures an impedance of the secondary battery. The secondary battery system detects high-rate deterioration caused by uneven concentration of the metal ions in the electrolytic solution impregnated into the electrode body.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
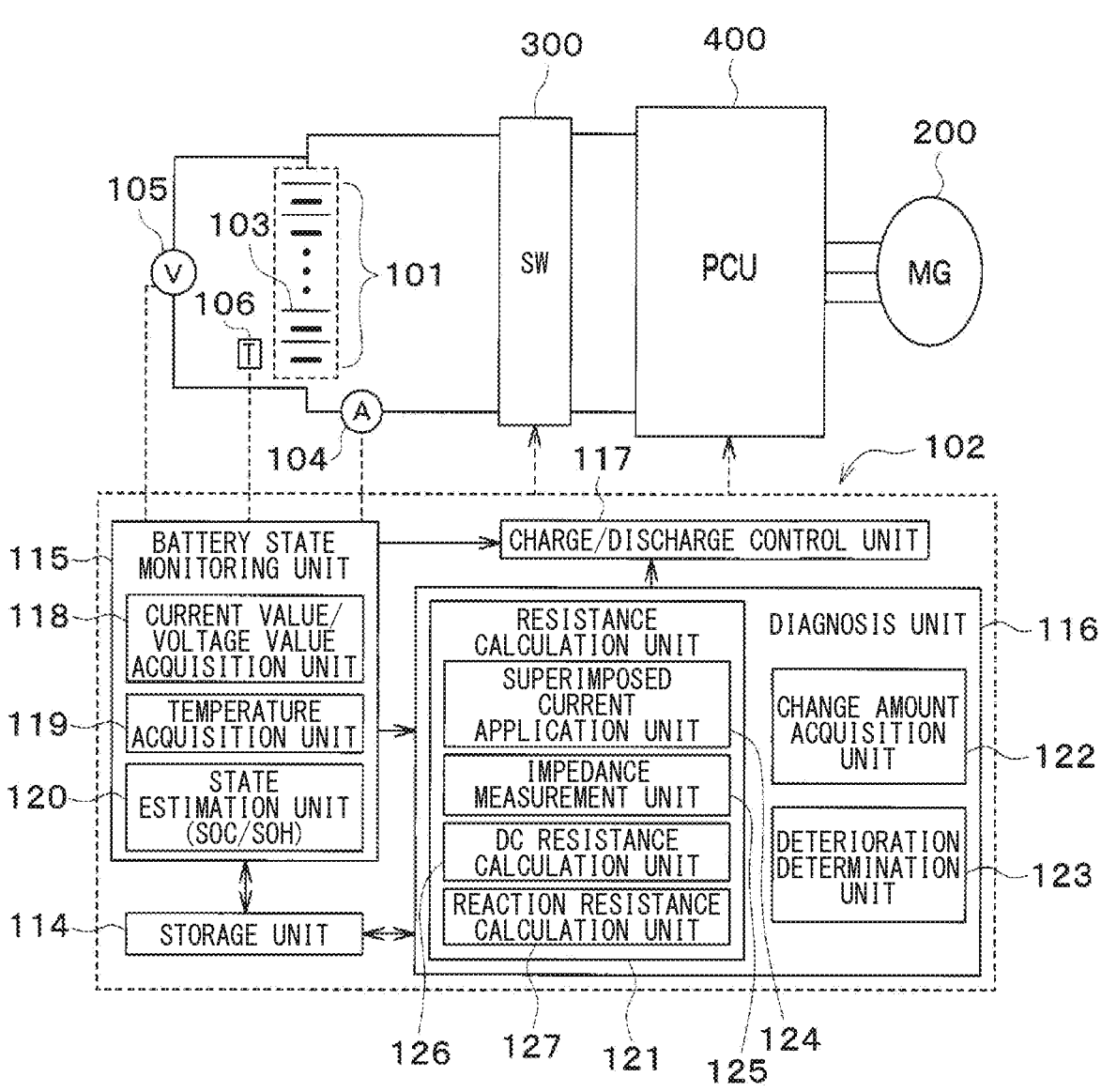
FIG. 1 is a diagram illustrating a configuration of a secondary battery system according to a first embodiment.

For example, a system has been proposed in which that DC resistance of the secondary battery is acquired from impedance of the secondary battery measured by a measurement device, and a state of high-rate deterioration is estimated using a difference from initial DC resistance of the secondary battery. In this configuration, a change in a DC resistance component among a plurality of impedance components of the secondary battery is used as an index indicating the progress of the high-rate deterioration.

Specifically, in a complex impedance plot of measurement results of the impedance, a DC resistance component represented as a start point of an arc is acquired. The high-rate deterioration is determined based on a difference from the initial DC resistance component, that is, an increase amount of the DC resistance component. When it is determined that the secondary battery in the high-rate deterioration, control for suppressing a charge or discharge current of the secondary battery is performed.

Here, in the above-described configuration, it is assumed that there is no change in the DC resistance component at the time of deterioration due to normal aging. However, through studies of the inventors, it has been found that even at the time of normal deterioration, for example, the DC resistance component increases due to formation of a solid electrolyte interphase (SEI) film due to storage deterioration on a surface of an electrode active material. In this case, it is difficult to accurately separate between the high-rate deterioration and a deterioration mode different from the high-rate deterioration.

The present disclosure provides a secondary battery system capable of easily separating a high-rate deterioration of a secondary battery and a deterioration mode different from the high-rate deterioration.

An exemplary embodiment of the present disclosure provides a secondary battery system that includes a secondary battery, an impedance measurement unit, and a diagnosis unit. The secondary battery has an electrode body impregnated with an electrolytic solution containing metal ions. The impedance measurement unit measures an impedance of the secondary battery. The diagnosis unit detects high-rate deterioration caused by uneven concentration of the metal ions in the electrolytic solution impregnated into the electrode body based on a change in the impedance of the secondary battery measured by the impedance measurement unit during direct current (DC) charging or discharging of the secondary battery.

The inventors have found that an uneven distribution of salt concentration of the electrolytic solution impregnated into the electrode body is increased during DC charging or discharging of the secondary battery, and the uneven distribution of the salt concentration appears as a change in impedance. Thus, the diagnosis unit can extract high-rate deterioration on the basis of the change in impedance during DC charging or discharging of the secondary battery. Therefore, it is possible to easily separate the high-rate deterioration of the secondary battery and the deterioration mode different from the high-rate deterioration.

Hereinafter, embodiments of the present disclosure will be described with reference to the drawings. In the following embodiments, the same or equivalent portions are denoted by the same reference numerals in the drawings.

First Embodiment

A secondary battery system according to the present embodiment extracts high-rate deterioration as deterioration of a secondary battery mounted on a vehicle. As illustrated in FIG. 1, a secondary battery system 100 includes a secondary battery 101 and a control device 102.

Figures 2, 3:
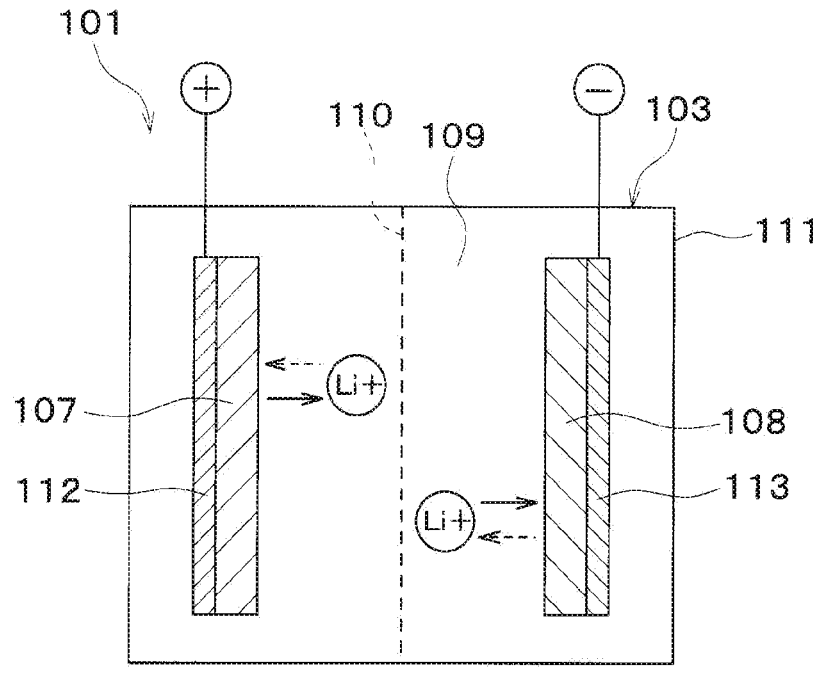
FIG. 2 is a diagram illustrating a configuration of the secondary battery illustrated in FIG. 1.
FIG. 3 is a diagram illustrating terms included in a theoretical formula of measurement influence by an external magnetic field.

As illustrated in FIG. 2, the secondary battery 101 constitutes a battery module in which a plurality of cells 103 are connected in series. Each of the cells 103 is, for example, a lithium ion secondary battery. The secondary battery 101 constitutes a power supply unit of an electric vehicle such as an electric car or a hybrid car. The battery module may include a configuration in which the cells 103 are connected in parallel.

The secondary battery 101 is connected to an in-vehicle motor generator (MG) 200 via a switch circuit unit 300 and a power control unit (PCU) 400. The secondary battery 101 is capable of supplying power for driving the MG 200 and recovering generated power during regeneration.

The secondary battery 101 is provided with a current sensor 104, a voltage sensor 105, and a temperature sensor 106. A detection signal of each sensor 104 to 106 is output to the control device 102 as needed.

Each cell 103 includes electrode bodies 107 and 108, an electrolytic solution 109, and a separator 110. The electrode body 107 is a positive electrode. The electrode body 107 contains, for example, a lithium composite oxide containing a transition metal such as Ni, Co, Fe or Mn and lithium as a positive electrode active material. The electrode body 108 is a negative electrode. The electrode body 108 contains, for example, a carbon-based material such as graphite as a negative electrode active material.

The electrolytic solution 109 is a solution containing an electrolyte. As the electrolytic solution 109, for example, a nonaqueous electrolytic solution in which a lithium salt is dissolved in a solvent such as ethylene carbonate is used. Each of the electrode bodies 107 and 108 is impregnated with the electrolytic solution 109. That is, the electrolytic solution 109 contains lithium ions as metal ions. The separator 110 is disposed between the electrode bodies 107 and 108. The separator 110 is a porous film that electrically insulates the electrode bodies 107 from the electrode body 108.

Each cell 103 of the secondary battery 101 is housed in a case 111. The secondary battery 101 is electrically connected to an external device by a positive electrode terminal and a negative electrode terminal taken out to the outside of the case 111. The positive electrode terminal is connected to one end of a positive electrode current collector 112 provided integrally with the electrode body 107 of each cell 103. The negative electrode terminal is connected to one end of a negative electrode current collector 113 provided integrally with the electrode body 108 of each cell 103. The positive electrode current collector 112 and the negative electrode current collector 113 are made of, for example, a metal foil or the like.

During charging of the secondary battery 101, lithium contained in the electrode body 107 is dissolved in the electrolytic solution 109, and lithium ions move in the electrolytic solution 109 and are retained in the negative electrode active material of the electrode body 108. On the other hand, during discharging, lithium ions are desorbed from the negative electrode active material of the electrode body 108, move in the electrolytic solution 109, and are retained in the positive electrode active material of the electrode body 107. The deterioration mode of the secondary battery 101 includes normal deterioration in which internal resistance increases due to repeated charging and discharging due to aging, and specific deterioration.

The normal deterioration is irreversible deterioration due to a change in an electrode structure, decomposition of the electrolytic solution 109, or the like. That is, the normal deterioration progresses over time. On the other hand, the specific deterioration is reversible deterioration indicating a temporary increase in internal resistance. That is, the specific deterioration can be recovered from the deterioration state.

The high-rate deterioration, which is an example of specific deterioration, is a phenomenon that occurs when a charge operation at a high input value or a discharge operation at a high output value is performed unevenly. The high-rate deterioration is deterioration in which the internal resistance increases due to generation of a lithium ion concentration distribution in the electrolytic solution 109.

Specifically, the high-rate deterioration is caused by uneven concentration of lithium ions in the electrolytic solution 109 impregnated into the electrode bodies 107 and 108. When the high-rate deterioration progresses, for example, there is a possibility of lithium deposition or the like in the electrode body 108.

Therefore, it is desirable to perform control to quickly detect the high-rate deterioration separately from the normal deterioration and suppress the progress of the high-rate deterioration. When the charge and discharge operation is stopped, deviation of the electrolytic solution 109 is alleviated with the lapse of time, and the state of high-rate deterioration is also eliminated.

The control device 102 appropriately controls charging and discharging so that the secondary battery 101 can be used safely according to the deterioration state of the secondary battery 101, The control device 102 includes a storage unit 114, a battery state monitoring unit 115, a diagnosis unit 116, and a charge or discharge control unit 117. The control device 102 includes an arithmetic processing device such as a CPU, and the storage unit 114 for storing a program and data. For example, the control device 102 is realized by a microcomputer having the storage unit 114 readable by a computer. The control device 102 operates as multiple functional blocks by executing the program. The battery state monitoring unit 115, the diagnosis unit 116, and the charge or discharge control unit 117 are all functional blocks.

The storage unit 114 stores a control program used by the control device 102, characteristic data necessary for control, and the like. The storage unit 114 stores data input from the battery state monitoring unit 115 and the diagnosis unit 116 as needed. The storage unit 114 is a non-transitory tangible storage medium for non-transitory storage of computer readable programs and data. The storage medium is realized by a semiconductor memory or the like. The storage unit 114 can also be referred to as a storage medium. The control device 102 may include a volatile memory for temporarily storing data.

The battery state monitoring unit 115 monitors the state of the secondary battery 101. The battery state monitoring unit 115 includes a current value/voltage value acquisition unit 118, a temperature acquisition unit 119, and a state estimation unit 120.

The current value/voltage value acquisition unit 118 acquires detection signals of the current sensor 104 and the voltage sensor 105. The temperature acquisition unit 119 acquires a detection signal of the temperature sensor 106. The state estimation unit 120 estimates a charge state or a deterioration state of the secondary battery 101 on the basis of each acquired value of each acquisition unit 118 to 120.

Specifically, the state estimation unit 120 calculates state quantities such as a state of charge (SOC) indicating a remaining battery level of the secondary battery 101 and a state of health (SOH) indicating a deterioration amount of the secondary battery 101. The SOH is represented by, for example, a ratio of the full charge capacity at the time of deterioration to the full charge capacity in the initial state.

The configuration of the battery module of the secondary battery 101 and the arrangement of each sensor 104 to 106 are conceptual, and are arbitrarily set according to the application and the like. The number of cells 103 of the battery module is not particularly limited, and the secondary battery 101 may be configured by connecting a plurality of battery modules in parallel or in series, or each sensor 104 to 106 may be provided for each cell 103.

Any method can be used to estimate the state quantity in the state estimation unit 120. For example, the SOC is estimated using a relationship with an open circuit voltage (OCV) of the secondary battery 101 or a relationship with an integrated value of a charge or discharge current. The SOH is estimated by using a relationship between an integrated current amount representing a battery state or a use environment and a temperature. Specifically, characteristic data representing these relationships is acquired in advance and stored in the storage unit 114 as a map value or a relational expression, and the SOC or the SOH can be estimated on the basis of the acquired value by each sensor 104 to 106.

A switch circuit unit 300 is provided between the secondary battery 101 and the PCU 400. The switch circuit unit 300 includes a charge switch that is turned on at the time of driving, that is, discharging the MG 200 or at the time of generating, that is, charging the MG 200, and a discharge switch that is turned on at the time of charging. The PCU 400 is configured as a power conversion device including an inverter that converts DC power of the secondary battery 101 into AC power, a converter for increasing or decreasing the voltage, and the like.

The charge or discharge control unit 117 controls opening or closing of the charge or discharge switch of the switch circuit unit 300 and an operation of the PCU 400. The charge or discharge control unit 117 outputs a control signal to the switch circuit unit 300 and the PCU 400 so that the charge power or the discharge power of the secondary battery 101 falls within an allowable range according to the SOC or the SOH estimated by the battery state monitoring unit 115.

The diagnosis unit 116 detects the high-rate deterioration on the basis of a change in impedance of the secondary battery 101 measured during DC charging or discharging of the secondary battery 101. Here, "during DC charging or discharging of the secondary battery 101" means that a direct current flows through the secondary battery 101. That is, during DC charging or discharging of the secondary battery 101 refers to when the direct current is passed through the secondary battery 101 for charging or when the direct current is passed through the secondary battery 101 for discharging. In the diagnosis of the high-rate deterioration according to the present embodiment, it is sufficient if a salt concentration gradient due to energization is generated in the secondary battery 101. Thus, the diagnosis can be utilized in both cases of charging and discharging.

Specifically, in the secondary battery 101, the diagnosis unit 116 detects the high-rate deterioration on the basis of a difference between impedance during DC charging or discharging and impedance when DC charging or discharging is not performed.

The impedance of the secondary battery 101 includes a DC resistance component and a reaction resistance component. The diagnosis unit 116 uses the fact that both the DC resistance component and the reaction resistance component obtained by the impedance measurement of the secondary battery 101 are affected by the liquid phase concentration during energization to diagnose the progress of the high-rate deterioration, which is specific deterioration, by distinguishing it from other deterioration modes. That is, the diagnosis unit 116 detects the high-rate deterioration by using both the DC resistance component and the reaction resistance component. Thus, it is possible to enhance detectability of the high-rate deterioration as compared with a case where only the DC resistance component is used for detecting the high-rate deterioration.

The diagnosis unit 116 includes a resistance calculation unit 121, a change amount acquisition unit 122, and a deterioration determination unit 123.

The resistance calculation unit 121 is a device that acquires the impedance of the secondary battery 101 by electrochemical impedance spectroscopy (EIS). The resistance calculation unit 121 calculates DC resistance R01 and reaction resistance Rct1 during DC charging or discharging in the secondary battery 101 and DC resistance R02 and reaction resistance Rct2 when DC charging or discharging is not performed in the secondary battery 101 on the basis of calculation results of the impedance at multiple measurement frequencies.

The resistance calculation unit 121 includes a superimposed current application unit 124, an impedance measurement unit 125, a DC resistance calculation unit 126, and a reaction resistance calculation unit 127.

The superimposed current application unit 124 applies a superimposed current in which a plurality of frequency components is superimposed to the secondary battery 101. By using the superimposed current, it is possible to collectively acquire the battery voltage when currents of a plurality of frequencies are applied to the secondary battery 101.

For example, a multiple sine wave can be employed as the superimposed current. As the superimposed current, a rectangular wave, a sawtooth wave, or a triangular wave can also be used. Here, with a harmonic wave for a fundamental frequency as the superposition frequency, the current value greatly decreases every time the order increases, but the current value does not decrease with the multiple sine wave. Thus, by employing the multiple sine wave as the superimposed current, high measurement accuracy can be maintained. In the multiple sine wave, the frequency to be superimposed is not particularly limited, and can be arbitrarily set in a frequency region corresponding to the DC resistance R01 and R02 and the reaction resistance Rct1 and Rct2.

The impedance measurement unit 125 measures the impedance of the secondary battery 101. Thus, the impedance measurement unit 125 acquires the current value of the superimposed current applied to the secondary battery 101 by the superimposed current application unit 124. The impedance measurement unit 125 acquires a response voltage when a superimposed current is applied to the secondary battery 101. Therefore, after the response voltage corresponding to the alternating current applied to the secondary battery 101 is measured, the impedance is a value calculated by dividing the response voltage by an alternating current as a complex number having information of an absolute value and a phase. That is, the impedance includes a real component Zreal and an imaginary component Zimage.

Specifically, the impedance measurement unit 125 calculates the impedance of the secondary battery 101 for each of the plurality of frequency components using a discrete Fourier transform. As the current value and the voltage value at the time of applying the superimposed current, detection values of the current sensor 104 and the voltage sensor 105 can be used. As the discrete Fourier transform, a fast discrete Fourier transform (FFT) can be employed.

Here, the DC charge or discharge current generates a magnetic field in the surroundings. A magnetic field is generated in a voltage detection line and a current detection line for impedance measurement. When an AC component is included in these magnetic fields and the frequency thereof is the same as the measured frequency of impedance measurement, noise is generated through the magnetic fields. That is, an error is given to the measured value of the impedance.

Accordingly, the impedance measurement unit 125 uses the following frequencies as frequencies for performing impedance measurement during DC charging or discharging of the secondary battery 101. That is, the impedance measurement unit 125 uses a frequency different from a frequency of an AC signal component included in a direct current for charging or discharging the secondary battery 101 and a frequency of a harmonic component included in the AC signal component. The AC signal component includes pulsation included in the direct current for charging or discharging, a resonance frequency component at the time of feedback, and the like. Thus, an error of an impedance measurement value can be reduced.

A theoretical formula of measurement influence of an external magnetic field includes a term below (this term is also illustrated in FIG. 3).

$$\left\{ -j \sum_i \frac{|I_{ex_i}(P)|}{|I_m(\omega_I)|} e^{j(-\theta_{Pex_i})} \sum_{ex_i} \right\}$$

This term includes a modulated current $I_m$ used for impedance measurement during DC charging or discharging of the secondary battery 101. The modulated current $I_m$ is a measured current on a substrate of the secondary battery 101.

The term includes an external current $I_{ex}$ having the same frequency as the frequency of the modulated current $I_m$ or the frequency of the harmonic component included in the modulated current $I_m$, or having the AC signal component included in the direct current for charging or discharging.

The external current $I_{ex}$ is a current flowing through a portion other than the substrate of the secondary battery 101. $\theta$ in the term is a phase difference between the modulated current $I_m$ and the external current $I_{ex}$.

Therefore, the impedance measurement unit 125 adjusts the modulated current $I_m$ so that a current ratio between the modulated current $I_m$ and the external current $I_{ex}$ is equal to or less than a threshold in impedance measurement during DC charging or discharging of the secondary battery 101. The influence of noise due to disturbance is proportional to the ratio between the modulated current $I_m$, which is the measured current, and the external current $I_{ex}$, which is the noise. Thus, the error decreases when the measured current is large.

The impedance measurement unit 125 outputs a calculated impedance for each of the plurality of frequency components to the DC resistance calculation unit 126 and the reaction resistance calculation unit 127. The impedance measurement unit 125 may store impedance data in the storage unit 114.

The DC resistance calculation unit 126 calculates the DC resistance R01 and R02 from a complex impedance plot based on the impedance for each frequency component. Specifically, the value of an intersection between a real number axis and an arc portion of the complex impedance plot is acquired as the DC resistance R01 and R02. Similarly, the reaction resistance calculation unit 127 acquires, as the resistance Rct1 and Rct2, the size of the arc portion starting from the intersection between the real number axis and the arc portion of the complex impedance plot.

The DC resistance calculation unit 126 and the reaction resistance calculation unit 127 correct the impedance measured by the impedance measurement unit 125 to an impedance corresponding to a predetermined temperature and a predetermined SOC. The DC resistance calculation unit 126 and the reaction resistance calculation unit 127 implement an algorithm for polynomializing temperature dependence of the impedance and normalizing the temperature dependence to an impedance of 25° C. The same applies to the SOC.

The predetermined temperature is, for example, 25° C. The predetermined SOC is, for example, 50%. In this manner, by standardizing the impedance to the predetermined temperature or the predetermined SOC, it is easy to compare the impedance at each temperature and to determine a control threshold.

The resistance calculation unit 121 is configured using, for example, a power conversion device constituting the in-vehicle PCU 400. Thus, it is not necessary to separately provide the superimposed current application unit 124 and the impedance measurement unit 125 including a superimposed current generation unit. A superimposed current of a large current can be generated. Therefore, a device configuration suitable for on-board diagnosis of the secondary battery 101 for vehicle mounting can be achieved. Alternatively, the superimposed current generation unit can be disposed in an on-vehicle charging device which is not illustrated or a charging device provided outside.

The change amount acquisition unit 122 calculates an absolute value of a difference between the impedance during DC charging or discharging and the impedance when DC charging or discharging is not performed. That is, the change amount acquisition unit 122 calculates |R01−R02| and |Rct1−Rct2| as a change amount of impedance.

The deterioration determination unit 123 compares the change amount of the impedance calculated by the change amount acquisition unit 122 with a reference value indicating the high-rate deterioration, and determines whether or not the high-rate deterioration occurs due to charging or discharging of the secondary battery 101. The reference value is set for each of the DC resistance and the reaction resistance.

The charge or discharge control unit 117 controls charge or discharge of the secondary battery 101. When the deterioration determination unit 123 of the diagnosis unit 116 determines that the high-rate deterioration has occurred, the charge or discharge control unit 117 performs control to limit the charge or discharge current of the secondary battery 101. The entire configuration of the secondary battery system 100 according to the present embodiment has been described above.

Next, the reason why the high-rate deterioration is detected on the basis of the change in impedance measured during DC charging or discharging of the secondary battery 101 as described above will be described.

First, the inventors examined a change in impedance when the secondary battery 101 was deteriorated under a predetermined deterioration condition. It is assumed that the secondary battery 101 has a capacity of 25 Ah, and is a prismatic cell having a positive electrode of NMC and a negative electrode of C. As impedance measurement conditions, the detection method was a lock-in amplifier, the amplitude was 500 mA, and the measurement frequency was 1 kHz to 2 Hz.

Figure 4:
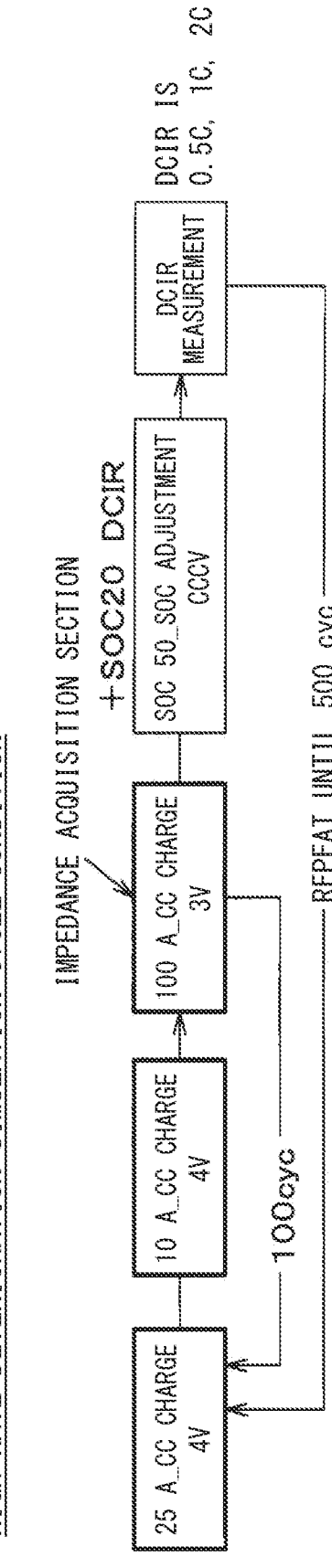
FIG. 4 is a diagram illustrating a simulation cycle.

Further, as illustrated in FIG. 4, a simulation cycle of repeating DC charging or discharging of the secondary battery 101 was performed to cause the high-rate deterioration. In the simulation cycle, the secondary battery 101 is subjected to CC charging at 25 A, further subjected to additional CC charging at 10 A, and then subjected to CC discharging at 100 A. For example, the simulation cycle is repeated 100 times. The impedance is measured during the simulation cycle.

DC internal resistance (DCIR) is measured every time the simulation cycle reaches 100 cycles. In this case, the SOC of the secondary battery 101 is adjusted to 50%, and the DCIR of the secondary battery 101 is acquired. The DC internal resistance is measured at, for example, currents of 0.5 C, 1 C, and 2 C. The DCIR measurement is performed to compare with the impedance measured during the simulation cycle. The simulation cycle is repeated 500 times.

Figure 5:
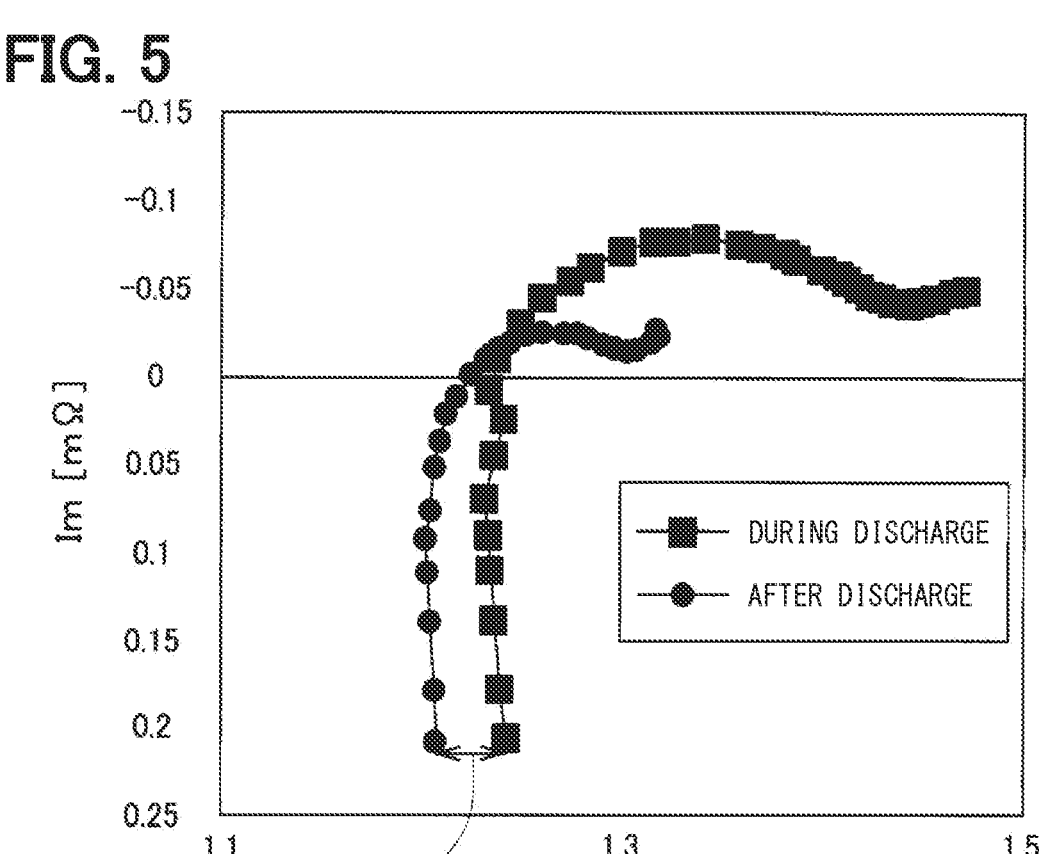
FIG. 5 is a diagram illustrating respective impedances during discharge and after discharge when the simulation cycle is performed.

FIG. 5 illustrates impedance measurement results at the time when the above simulation cycle was repeated 500 times. As illustrated in FIG. 5, when looking at the DC resistance on the horizontal axis, the resistance value decreased from during discharge to after discharge. Similarly, when viewing the reaction resistance on the vertical axis, the resistance value decreased from during discharge to after discharge.

Figure 6:
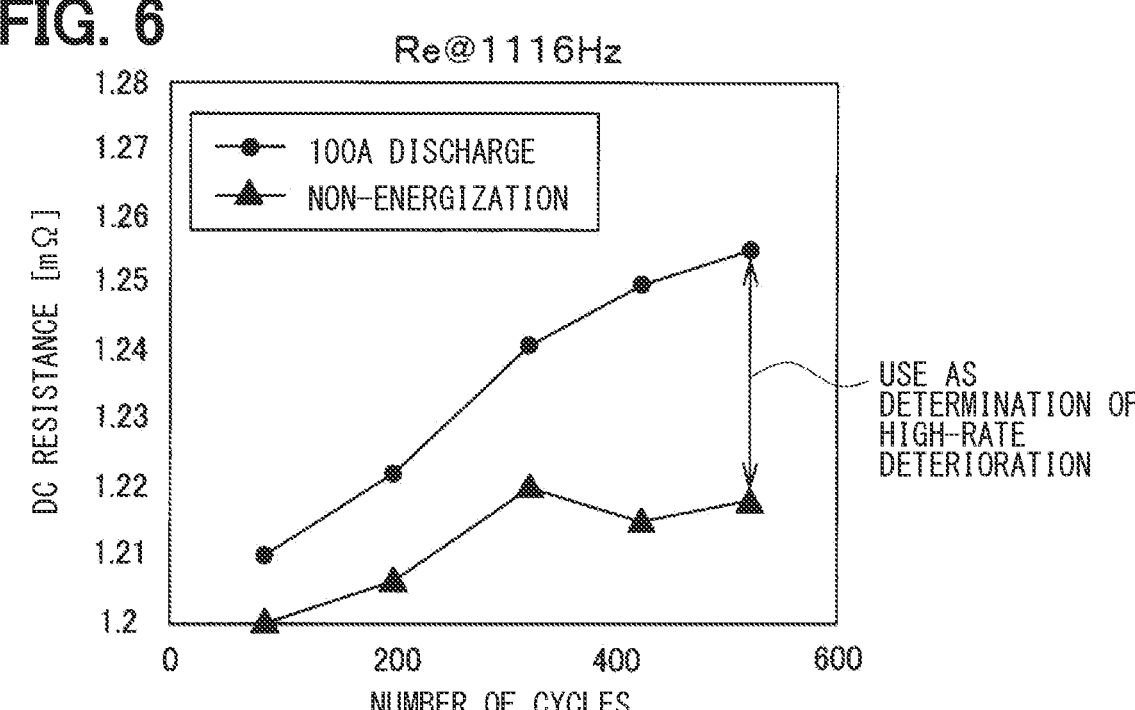
FIG. 6 is a diagram illustrating a change in DC resistance according to the number of simulation cycles in DC resistance at 1116 Hz illustrated in FIG. 5.

Among the DC resistance illustrated in FIG. 5, DC resistance corresponding to the number of cycles at 1116 Hz is illustrated in FIG. 6. As illustrated in FIG. 6, with respect to the DC resistance, the DC resistance at the end of discharge when a direct current of 100 A was passed through the secondary battery 101 was higher than the DC resistance during absence of energization after a certain period of time from the end of the discharge of 100 A. As the number of cycles of the simulation cycle increased, the difference in DC resistance between when the current was flowing and when the current was not flowing increased. This is because the influence of the high-rate deterioration is strongly reflected when the current flows through the secondary battery 101, but the DC resistance during absence of energization includes not only the influence of the high-rate deterioration but also the influence of other deterioration modes such as normal deterioration. Therefore, the resistance difference can be used for determination of the high-rate deterioration.

The inventors examined transition of impedance in normal deterioration and transition of impedance in the high-rate deterioration. Results are illustrated in FIGS. 7 and 8.

Figure 7:
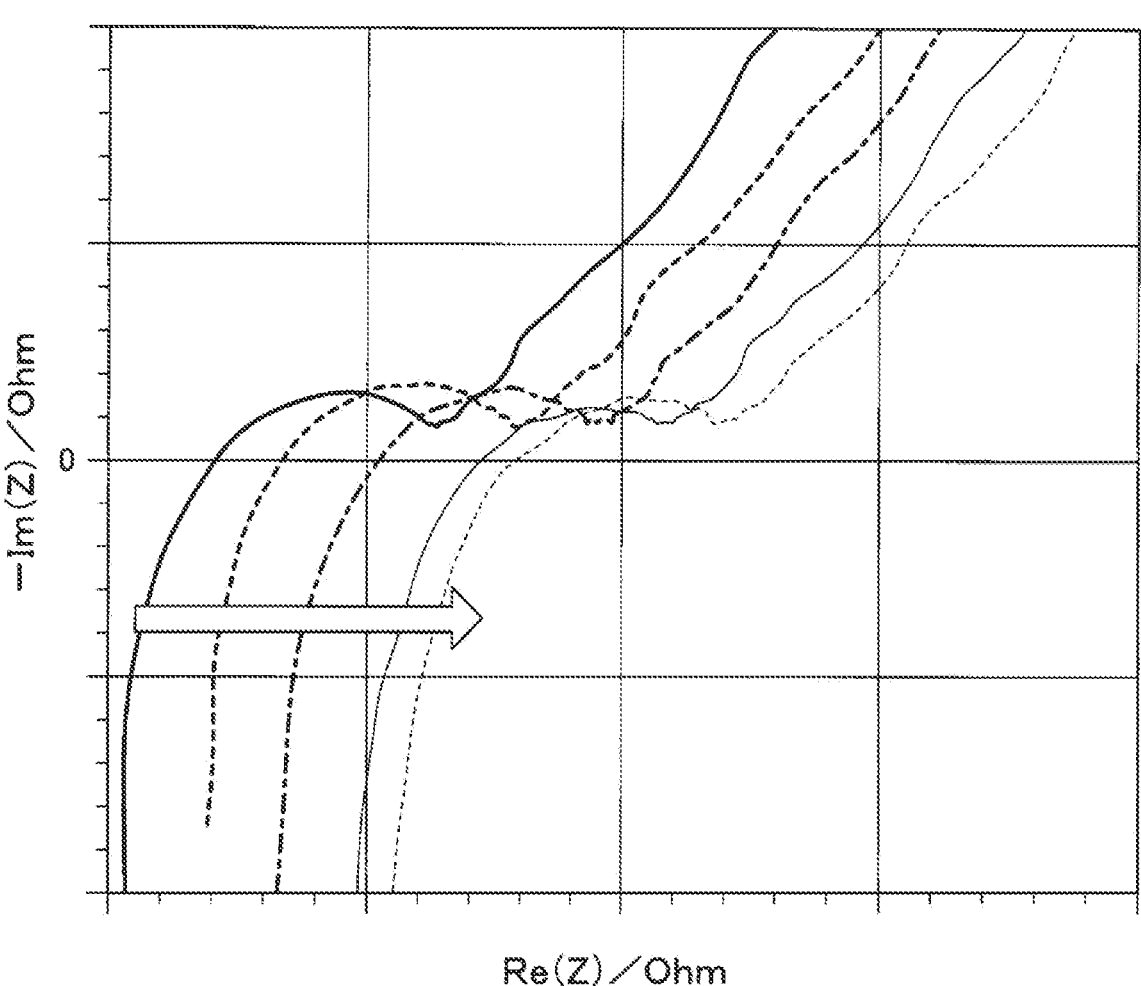
FIG. 7 is a diagram illustrating transition of impedance during a storage deterioration test of the secondary battery.

FIG. 7 illustrates results of a deterioration test in which the secondary battery 101 is stored at 60° C. for several months as one of normal deterioration. No current flows through the secondary battery 101. In this case, the impedance changes along the horizontal axis with the lapse of time. Specifically, the DC resistance increases with time.

Figures 8, 9:
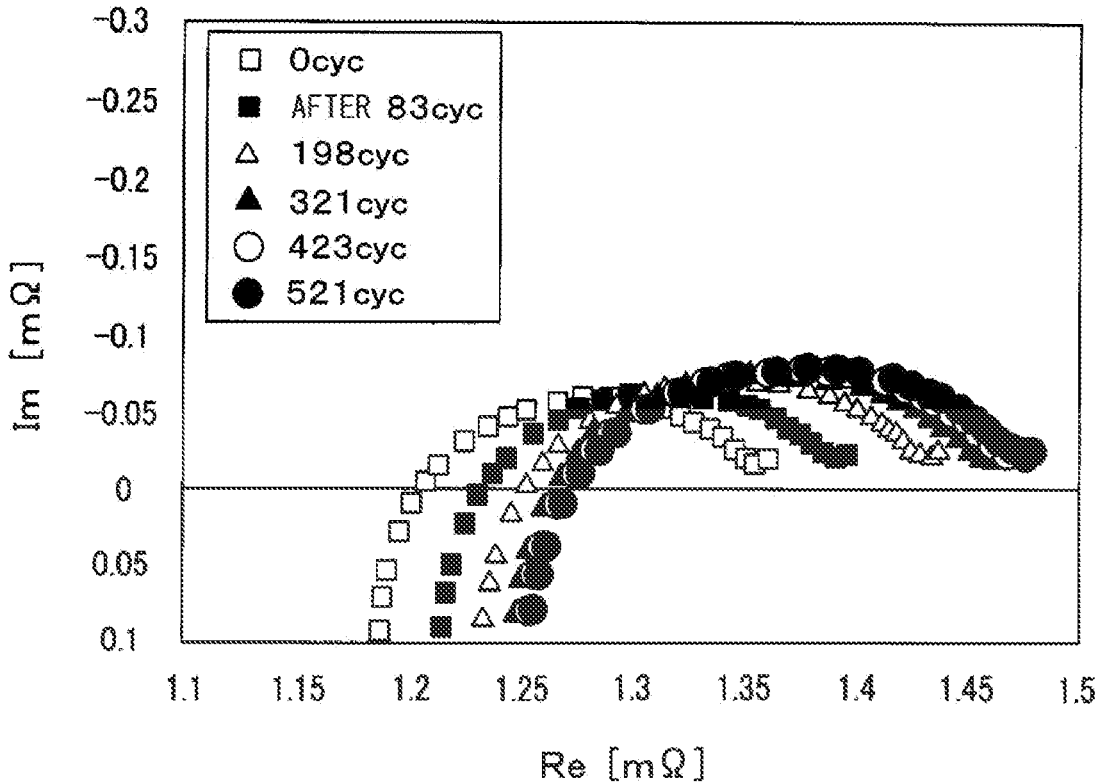
FIG. 8 is a diagram illustrating transition of impedance during high-rate deterioration of the secondary battery when not energized.
FIG. 9 is a diagram illustrating respective deterioration determination output values in a case where the high-rate deterioration is determined without passing a direct current through the secondary battery and in a case where the high-rate deterioration is determined by passing a direct current through the secondary battery.

On the other hand, in FIG. 8, the impedance during the high-rate deterioration when the secondary battery 101 is not energized is illustrated. Even in the impedance during the high-rate deterioration, the DC resistance increases as the number of simulation cycles increases.

As described above, when no current flows through the secondary battery 101, the DC resistance increases in both the storage deterioration test and the high-rate deterioration, and thus it is difficult to separate the high-rate deterioration from other deterioration modes. However, the increase in DC resistance illustrated in FIGS. 5 and 6 does not appear in the storage deterioration test of FIG. 7. The same applies to an increase in reaction resistance. From this, the inventors have found that the high-rate deterioration and other deterioration modes can be separated by utilizing impedance when a current flows through the secondary battery 101.

For example, as illustrated in FIG. 9, in a conventional method of determining the high-rate deterioration on the basis of the impedance when the direct current is not passed through the secondary battery 101, the cell after the high-rate deterioration cycle can be determined to be the high-rate deterioration. However, the cell after the storage deterioration test surrounded by a thick frame was determined to be the high-rate deterioration, but it was not actually the high-rate deterioration.

On the other hand, in the method of the present disclosure in which the high-rate deterioration is determined on the basis of the impedance when the direct current is passed through the secondary battery 101, both the cell after the storage deterioration test and the cell after the high-rate deterioration cycle can be determined to be the high-rate deterioration. Therefore, by detecting the high-rate deterioration by a resistance increment during the DC charging or discharging of the secondary battery 101, it is easy to separate the high-rate deterioration from other deterioration modes.

In the high-rate deterioration cell, an increase in both the DC resistance and the reaction resistance was confirmed at the end of discharge of the secondary battery 101. For example, FIG. 10 illustrates results when a cycle of repeating 4 C discharge and 1 C charge is performed.

Figure 10:
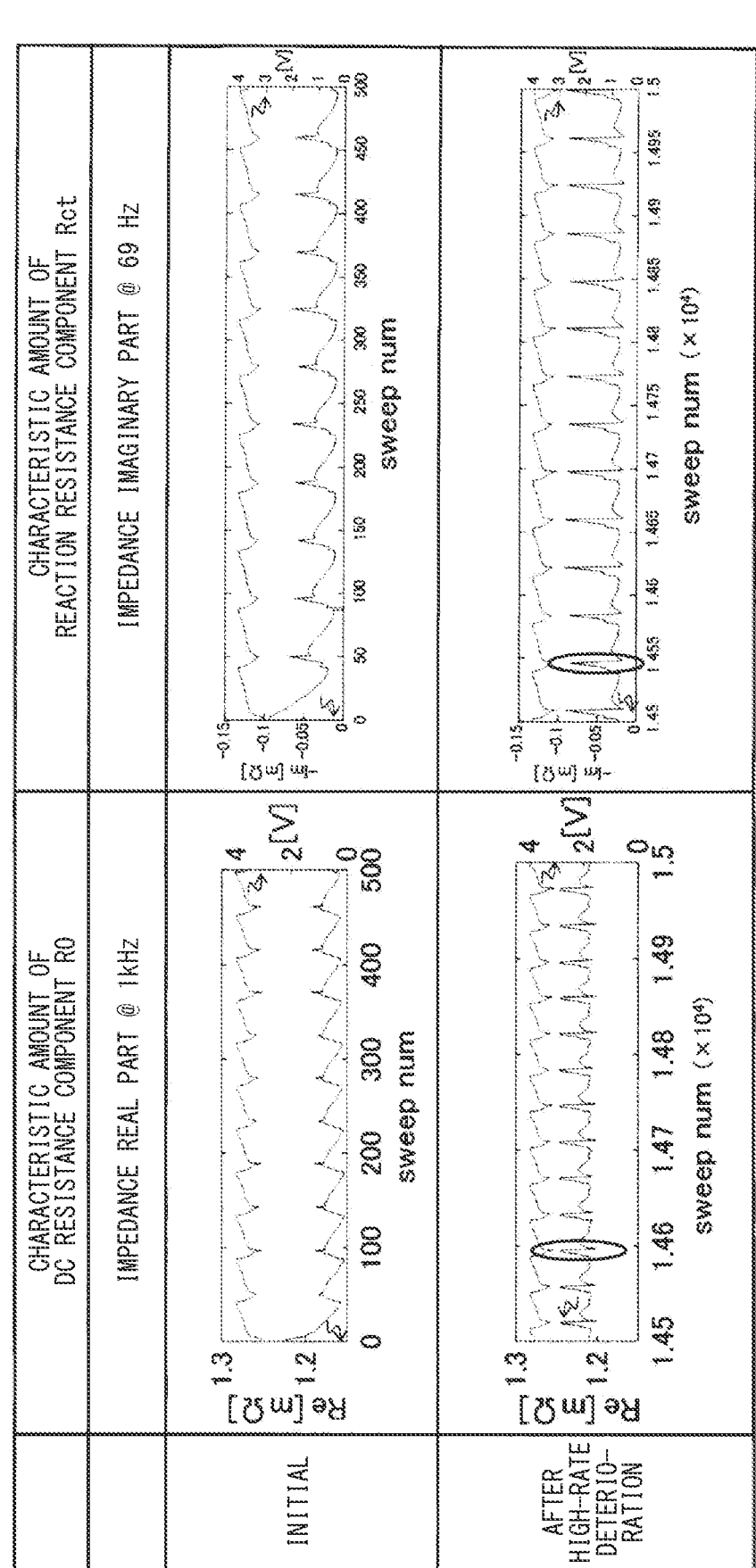
FIG. 10 is a diagram illustrating respective characteristic amounts of a direct current component and a reaction resistance component.

"Initial" illustrated in FIG. 10 refers to the conventional method of determining the high-rate deterioration on the basis of the impedance when the direct current is not passed through the secondary battery 101. "After high-rate deterioration" refers to a method of the present disclosure for determining the high-rate deterioration on the basis of impedance when a direct current is passed through the secondary battery 101.

As illustrated in FIG. 10, in the initial case, Re, which is an impedance real part at 1 kHz, as the characteristic amount of the direct current component repeats up and down in accordance with repetition of the cycle. Similarly, as the characteristic amount of the reaction resistance component, $-I_m$, which is an impedance imaginary part at 69 Hz, is repeated up and down according to the repetition of the cycle. However, no characteristic behavior was observed.

On the other hand, characteristic peaks appeared for respective characteristic amounts of the direct current component and the reaction resistance component after the high-rate deterioration. As described above, since an increase in both the DC resistance and the reaction resistance was confirmed at the end of discharge of the secondary battery 101, the detectability of the high-rate deterioration can be increased by utilizing both the DC resistance component and the reaction resistance component.

Figure 11:
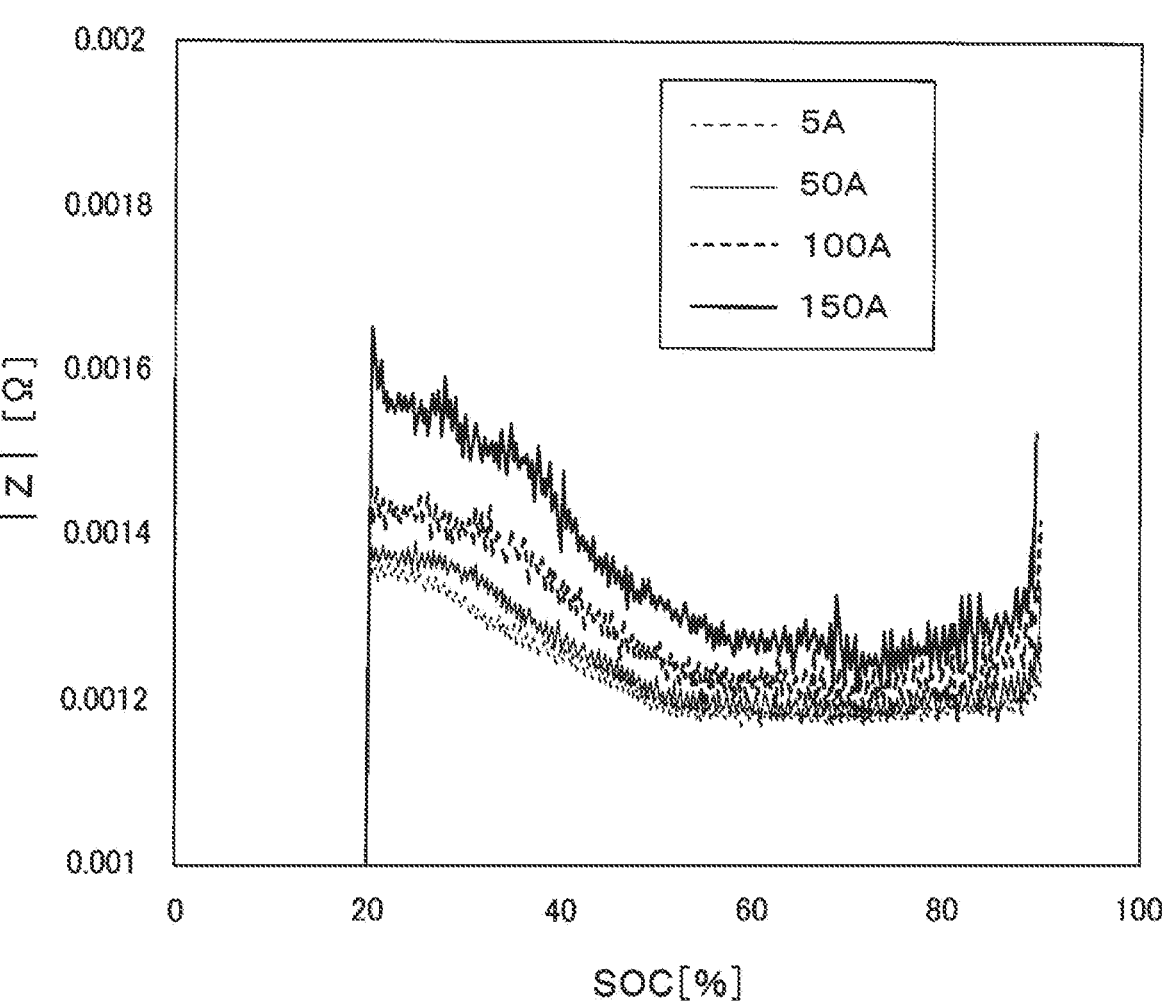
FIG. 11 is a diagram illustrating a relationship between magnitude of a direct current and impedance variation.

Here, in order to utilize the increase in resistance, the inventors examined the relationship between the magnitude of the DC discharge current and the increase in resistance by simulation. Results are illustrated in FIG. 11. The secondary battery 101 had a capacity of 25 Ah and a temperature of 25° C.

As illustrated in FIG. 11, the resistance value increased as the SOC decreased from 90% to 20% by passing a discharge current through the secondary battery 101. In particular, the resistance increase was the largest when the discharge current was set to 150 A. Since the discharge current was 6 C, the behavior of resistance increase appeared in 10 minutes. That is, when DC 5 A=0.2 C or more, it is expected that an increase in resistance during energization of the secondary battery 101 can be observed.

Therefore, an average value of the direct current flowing through the secondary battery 101 in a section of 10 minutes or more is preferably 0.2 C or more of the battery capacity, Thus, as the current value of the direct current is larger and the current flow time is longer, the salt concentration gradient becomes larger, and the detectability of the high-rate deterioration can be increased.

Figure 12:
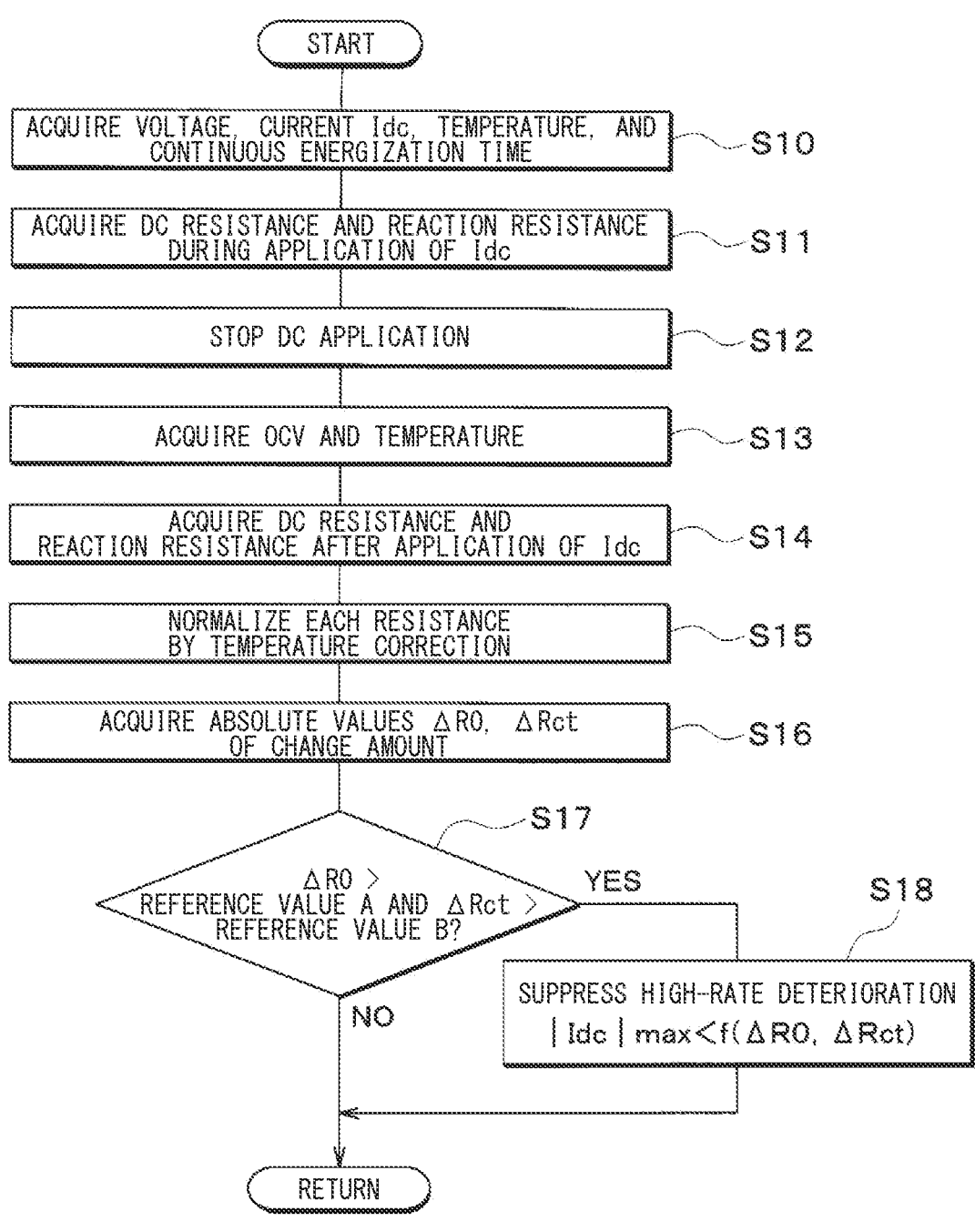
FIG. 12 is a flowchart illustrating diagnosis contents of the high-rate deterioration of the secondary battery in a diagnosis unit of a control device.

Subsequently, a flow of diagnosing the high-rate deterioration of the secondary battery 101 will be specifically described with reference to FIG. 12. The flow illustrated in FIG. 12 is executed by the diagnosis unit 116 of the control device 102.

First, in step S10, the current voltage, current Idc, and temperature of the secondary battery 101 are acquired. A continuous energization time of the secondary battery 101 is acquired. Each data of the voltage, the current Idc, the temperature, and the continuous energization time is acquired by the battery state monitoring unit 115.

The continuous energization time is, for example, a time during which a current is continuously passed from the secondary battery 101 to the MG 200. For example, a continuous energization time within a certain period of time is acquired.

In step S11, the DC resistance R01 and the reaction resistance Rct1 when the current Idc is applied to the secondary battery 101 are acquired by the resistance calculation unit 121. The current Idc is a current flowing through the secondary battery 101 during DC charging or DC discharging.

In step S12, the DC application is stopped. That is, the direct current flowing through the secondary battery 101 is stopped. In other words, the DC discharge of the secondary battery 101 is stopped. Thus, the secondary battery 101 is not DC charged or discharged.

In step S13, the OCV and the temperature of the secondary battery 101 are acquired. The OCV is used to calculate the SOC of the secondary battery 101.

The temperature is a temperature when no direct current flows through the secondary battery 101. There is a temperature difference between the temperature when the direct current flows through the secondary battery 101, that is, the temperature acquired in step S10 and the temperature when no direct current flows through the secondary battery 101, that is, the temperature acquired in this step. Therefore, the temperature difference is taken into consideration when the impedance is converted into a predetermined temperature.

In step S14, the DC resistance R02 and the reaction resistance Rct2 after the current Idc is applied to the secondary battery 101 are acquired by the resistance calculation unit 121. That is, the DC resistance R02 and the reaction resistance Rct2 when DC charging or discharging is not performed in the secondary battery 101 are acquired.

In step S15, the DC resistance R01 and the reaction resistance Rct1 during DC charging or discharging of the secondary battery 101, and the DC resistance R02 and the reaction resistance Rct2 when DC charging or discharging is not performed in the secondary battery 101 are normalized by temperature correction. Each resistance is converted into an impedance at a temperature of, for example, 25° C.

In step S16, absolute values $\Delta R0$ and $\Delta Rct$ of the difference between the resistance of the secondary battery 101 during DC charging or discharging and the resistance of the secondary battery 101 during absence of energization, that is, the change amount of impedance are acquired. The absolute value $\Delta R0$ of the change amount of the DC resistance is obtained by $\Delta R0=|R01-R02|$. The absolute value $\Delta Rct$ of the change amount of the reaction resistance is obtained by $\Delta Rct=|Rct1-Rct2|$.

In step S17, it is determined whether $\Delta R0$>reference value A and $\Delta Rct$>reference value B are satisfied. The reference value A is a predetermined value set in advance according to the relationship between the absolute value of the change amount of the DC resistance and the high-rate deterioration. The reference value B is a predetermined value set in advance according to the relationship between the absolute value of the change amount of the reaction resistance and the high-rate deterioration. In a case where $\Delta R0$>reference value A and $\Delta Rct$>reference value B are satisfied in step S17, the processing proceeds to step S18.

In step S18, control for suppressing the DC charge or discharge current of the secondary battery 101, that is, control for suppressing the high-rate deterioration is performed. For example, the charge or discharge control unit 117 controls the current Idc of the secondary battery 101 to satisfy |Idc| max<f ($\Delta R0$, $\Delta Rct$). f is a function represented by $\Delta R0$ and $\Delta Rct$. At the time of control, each data acquired in step S10 may be used. The processing returns to step S10, and the flow is repeated.

In step S17, when $\Delta R0$>reference value A and $\Delta Rct$>reference value B are not satisfied, the processing returns to step S10, and the flow is repeated. The above is the diagnosis flow of the high-rate deterioration.

The inventors examined a resistance increase rate when input and output of the secondary battery 101 were restricted after the above-described simulation cycle was repeated. The SOC was adjusted to 50%, and the current was applied to the secondary battery 101 for 120 seconds. Results are illustrated in FIG. 13.

Figure 13:
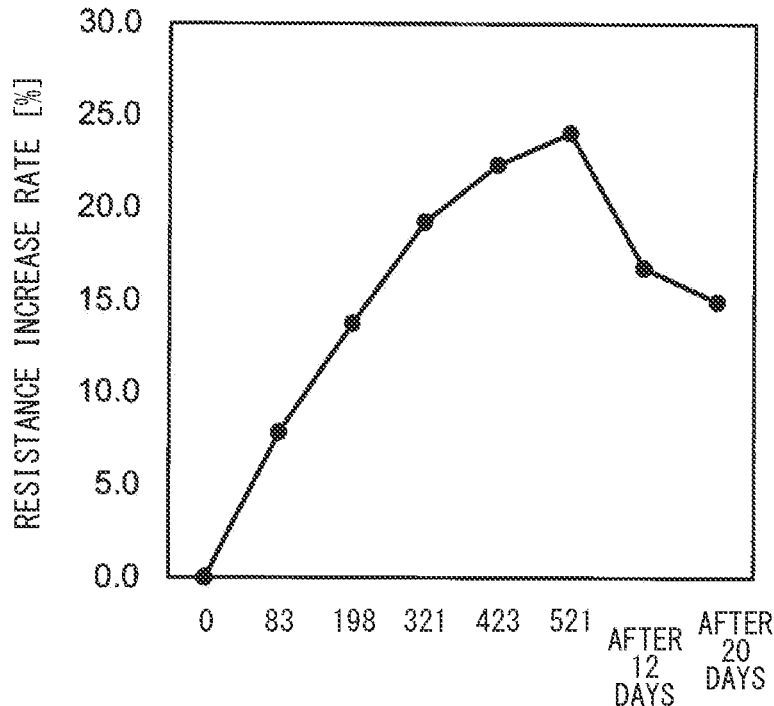
FIG. 13 is a diagram illustrating a change in a resistance increase rate when input and output of the secondary battery were restricted after a simulation cycle was repeated.

As illustrated in FIG. 13, by repeating the simulation cycle up to 521 cycles, the resistance increase rate increased with the progress of the high-rate deterioration. After 521 cycles of the simulation cycle, input and output restriction was carried out and the secondary battery 101 was left alone, and resistance decreased after 12 days. After 20 days, the resistance further decreased.

This is considered to be because the increase in resistance was reversibly alleviated by restricting the input and output of the secondary battery 101 after detecting a salt concentration uneven distribution. Therefore, the high-rate deterioration can be alleviated by restricting the input and output of the secondary battery 101.

As described above, in the present embodiment, the high-rate deterioration, which is a salt concentration uneven distribution abnormality of the secondary battery 101, is detected from a variation amount between the impedance during energization and the impedance during absence of energization by utilizing a property that the salt concentration uneven distribution is likely to appear in a liquid phase during DC charging or discharging of the secondary battery 101. Thus, it is possible to easily separate the high-rate deterioration of the secondary battery 101 and the deterioration mode different from the high-rate deterioration.

First, the DC resistance R01 and the reaction resistance Rct1 during DC charging or discharging are acquired in the secondary battery 101, and then, the DC resistance R02 and the reaction resistance Rct2 when DC charging or discharging is not performed are acquired so as to diagnose the high-rate deterioration. Thus, it is possible to diagnose the high-rate deterioration when the SOC of the secondary battery 101 does not vary, so that it is not necessary to convert the SOC into the predetermined SOC, and a simple diagnosis can be performed.

Second Embodiment

Figure 14:
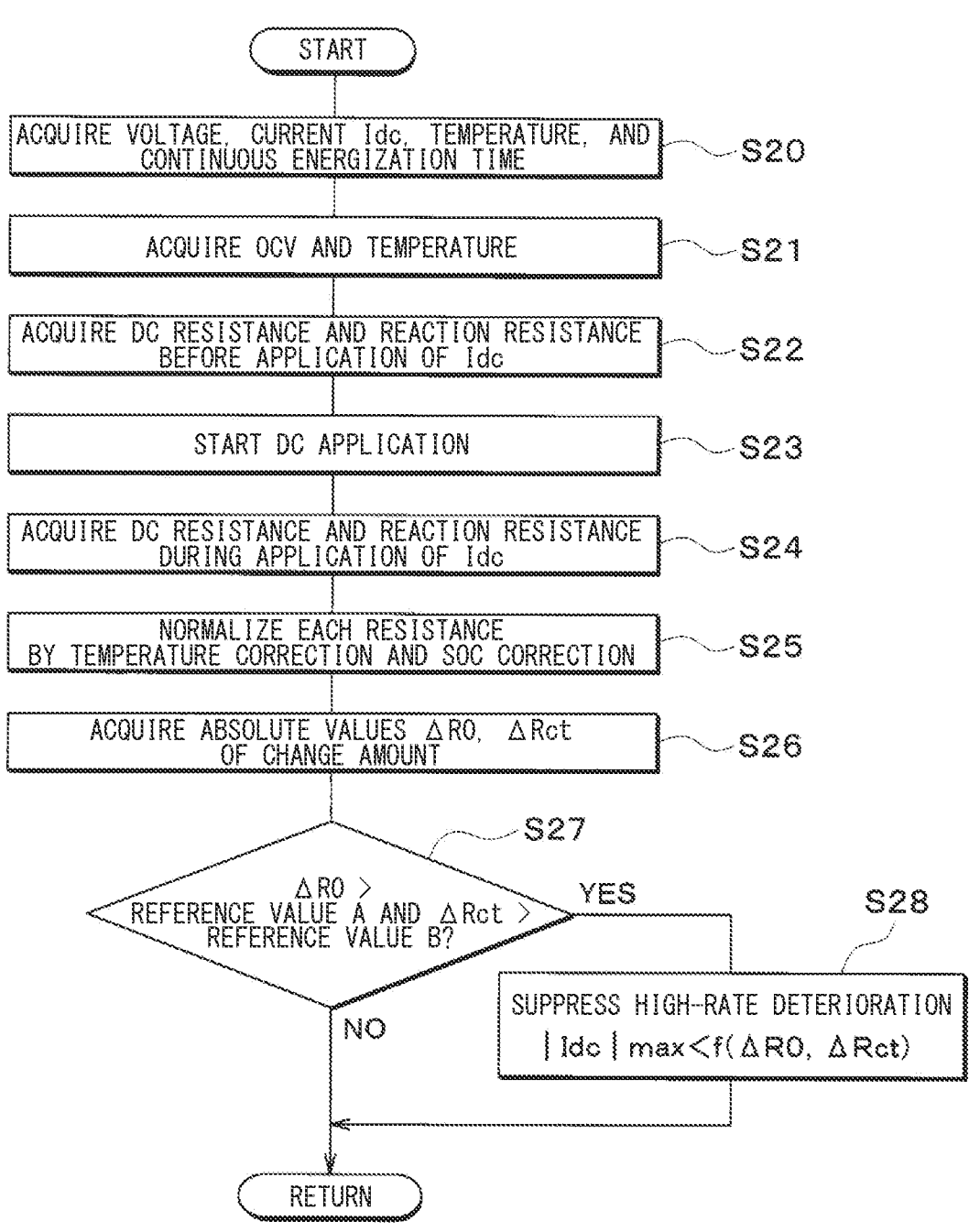
FIG. 14 is a flowchart illustrating diagnostic contents of the high-rate deterioration of the secondary battery according to a second embodiment.

In the present embodiment, differences from the first embodiment will be mainly described. In the present embodiment, the high-rate deterioration of the secondary battery 101 is diagnosed according to the flow illustrated in FIG. 14.

First, in step S20, the current voltage, current Idc, and temperature of the secondary battery 101 and the continuous energization time of the secondary battery 101 are acquired as in step S10.

Subsequently, in step S21, the OCV and the temperature of the secondary battery 101 are acquired as in step S13.

In step S22, the DC resistance R01 and the reaction resistance Rct1 before the current Idc is applied to the secondary battery 101 are acquired by the resistance calculation unit 121.

Thereafter, in step S23, DC application is started. That is, a direct current flows through the secondary battery 101. Thus, the secondary battery 101 is in a state of being DC charged and discharged.

In step S24, the DC resistance R01 and the reaction resistance Rct1 when the current Idc is applied to the secondary battery 101 are acquired as in step S11.

In step S25, the DC resistance R01 and the reaction resistance Rct1 during DC charging or discharging of the secondary battery 101, and the DC resistance R02 and the reaction resistance Rct2 when DC charging or discharging is not performed in the secondary battery 101 are normalized by temperature correction and SOC correction. Each resistance is converted to, for example, an impedance at a temperature of 25° C. and an SOC of 50%.

In steps S26, S27, and S28, the same processing as steps S16, S17, and 318 is performed. The above is the high-rate deterioration diagnosis flow according to the present embodiment.

As described above, the DC resistance R02 and the reaction resistance Rct2 when DC charging or discharging is not performed in the secondary battery 101 are acquired first, and then the DC resistance R01 and the reaction resistance Rct1 during DC charging or discharging are acquired so as to diagnose the high-rate deterioration. In this case, it is possible to diagnose the high-rate deterioration during DC charging or discharging of the secondary battery 101.

OTHER EMBODIMENTS

The configuration of the secondary battery system 100 illustrated in each of the above embodiments is an example, and without being limited to the configurations described above, other configurations that can achieve the present disclosure can also be employed. For example, the secondary battery 101 is not limited to a case of being mounted on an electric vehicle, and includes a case of being installed at a predetermined place.

The secondary battery 101 is not limited to a lithium ion battery. Since the high-rate deterioration is a salt concentration uneven event in a liquid phase, it is possible to diagnose the high-rate deterioration by the above method in a case of a liquid type battery other than a lithium ion battery,

What is claimed is:

1. A secondary battery system comprising:
a secondary battery having an electrode body impregnated with an electrolytic solution containing metal ions; and
at least one processor with a memory storing computer program code executable by the processor configured to cause the secondary battery system to implement:
an impedance measurement unit configured to measure an impedance of the secondary battery; and
a diagnosis unit configured to detect high-rate deterioration, which is caused by uneven concentration of the metal ions in the electrolytic solution impregnated into the electrode body, in the secondary battery based on an absolute value of a difference between a direct current (DC) resistance component and a reaction resistance component of the impedance measured by the impedance measurement unit during DC charging or discharging and the impedance measured by the impedance measurement unit after DC charging or discharging has stopped,
wherein the diagnosis unit determines that high-rate deterioration has occurred in the secondary battery when the absolute value of the difference exceeds a predetermined reference value.

2. The secondary battery system according to claim 1, wherein
an average value of a direct current flowing through the secondary battery in a section of equal to or longer than 10 minutes is equal to or greater than 0.2 C of a battery capacity.

3. The secondary battery system according to claim 1, wherein
the diagnosis unit corrects the impedance measured by the impedance measurement unit to an impedance corresponding to a predetermined temperature and a predetermined state of charge (SOC).

4. The secondary battery system according to claim 1, wherein the at least one processor is further configured to cause the secondary battery system to implement:
a charge or discharge control unit configured to perform control for suppressing a charge or discharge current of the secondary battery when a difference between resistance during DC charge or discharge of the secondary battery and resistance during absence of energization of the secondary battery is larger than a predetermined value.

5. The secondary battery system according to claim 1, wherein the impedance measurement unit uses, as a frequency for measuring the impedance during DC charging or discharging of the secondary battery, a frequency different from a frequency of an alternating current (AC) signal component included in a direct current for charging or discharging the secondary battery and a frequency of a harmonic component included in the AC signal component.

6. The secondary battery system according to claim 1, wherein in measuring the impedance during DC charging or discharging of the secondary battery, the impedance measurement unit adjusts modulated current used for measuring the impedance such that a current ratio between the modulated current and an external current having a same frequency as a frequency of the modulated current or a frequency of a harmonic component included in the modulated current, or an external current having an alternating current (AC) signal component included in a direct current to be charged and discharged is equal to or less than a threshold.

7. A secondary battery system comprising:

a secondary battery having an electrode body impregnated with an electrolytic solution containing metal ions; and at least one processor configured to measure an impedance of the secondary battery, and detect high-rate deterioration, which is caused by uneven concentration of the metal ions in the electrolytic solution impregnated into the electrode body, in the secondary battery based on an absolute value of a difference between a direct current (DC) resistance component and a reaction resistance component of the impedance during DC charging or discharging and the impedance after DC charging or discharging has stopped, wherein the at least one processor determines that high-rate deterioration has occurred in the secondary battery when the absolute value of the difference exceeds a predetermined reference value.

\* \* \* \* \*